(12) United States Patent
Chung

(10) Patent No.: US 11,703,121 B2
(45) Date of Patent: Jul. 18, 2023

(54) ACTUATOR DIAGNOSTIC APPARATUS OF ELECTRONIC CONTROL UNIT FOR VEHICLE AND METHOD THEREFOR

(71) Applicant: Vitesco Technologies GmbH, Regensburg (DE)

(72) Inventor: MinCheol Chung, Munich (DE)

(73) Assignee: Vitesco Technologies GmbH, Hannover (DE)

( * ) Notice: Subject to any disclaimer, the term of this patent is extended or adjusted under 35 U.S.C. 154(b) by 17 days.

(21) Appl. No.: 17/615,238

(22) PCT Filed: May 29, 2020

(86) PCT No.: PCT/EP2020/064947
§ 371 (c)(1),
(2) Date: Nov. 30, 2021

(87) PCT Pub. No.: WO2020/239970
PCT Pub. Date: Dec. 3, 2020

(65) Prior Publication Data
US 2022/0235861 A1    Jul. 28, 2022

(30) Foreign Application Priority Data
May 30, 2019   (KR) .................. 10-2019-0063813

(51) Int. Cl.
*F16H 61/12*   (2010.01)
*F16H 61/02*   (2006.01)

(52) U.S. Cl.
CPC ......... *F16H 61/12* (2013.01); *F16H 61/0251* (2013.01); *F16H 2061/1208* (2013.01);
(Continued)

(58) Field of Classification Search
CPC ................ F16H 61/12; F16H 61/0251; F16H 2061/1208; B60W 50/0205; H01F 7/1844
See application file for complete search history.

(56) References Cited

U.S. PATENT DOCUMENTS 3,032,274 A1   10/2011   Niwa et al.
9,194,355 B2   11/2015   Zweege et al.
(Continued)

FOREIGN PATENT DOCUMENTS

DE   19611522 A1   9/1997
JP   4379448 B2    12/2009
(Continued)

*Primary Examiner* — Edwin A Young
(74) *Attorney, Agent, or Firm* — Laurence A. Greenberg; Werner H. Stemer; Ralph E. Locher

(57) ABSTRACT

An actuator diagnostic apparatus is provided for an electronic control unit of a vehicle. The actuator diagnostic apparatus of the electronic control unit for a vehicle is characterized by containing: a high-side driver which drives an actuator from a high-side; an output voltage sensing unit which senses an output voltage of the high-side driver; a low-side driver which drives the actuator from a low-side; a pull-down switch which pulls down an input voltage of the high-side driver; a shutdown driver which actuates the pull-down switch; and a diagnostic control unit which diagnoses shutdown of the actuator upon receiving an input of the output voltage from the output voltage sensing unit after respectively actuating the high-side driver, the low-side driver, and the shutdown driver in accordance with a shutdown diagnosis order.

7 Claims, 2 Drawing Sheets

(52) U.S. Cl.
CPC ............... *F16H 2061/1224* (2013.01); *F16H 2061/1288* (2013.01)

(56) References Cited

U.S. PATENT DOCUMENTS

| | | | |
|---|---|---|---|
| 9,477,212 B2 | 10/2016 | Le et al. | |
| 2017/0290118 A1* | 10/2017 | Takagimoto | H05B 45/37 |
| 2018/0167063 A1* | 6/2018 | Akahane | H02M 1/088 |
| 2020/0161973 A1* | 5/2020 | Fukushima | H02M 3/158 |
| 2020/0350814 A1* | 11/2020 | Nakakohara | H03K 17/687 |
| 2022/0094262 A1* | 3/2022 | Jaksa | H02M 1/4216 |

FOREIGN PATENT DOCUMENTS

| | | |
|---|---|---|
| KR | 19990005565 A | 1/1999 |
| KR | 100577711 B1 | 5/2006 |
| KR | 101049392 B1 | 7/2011 |
| KR | 101566720 B1 | 11/2015 |
| KR | 20160026489 A | 3/2016 |
| KR | 20160063896 A | 6/2016 |
| KR | 20160132890 A | 11/2016 |

\* cited by examiner

ACTUATOR DIAGNOSTIC APPARATUS OF ELECTRONIC CONTROL UNIT FOR VEHICLE AND METHOD THEREFOR

FIELD AND BACKGROUND OF THE INVENTION

The present invention relates to an actuator diagnostic apparatus of an electronic control unit for a vehicle and to a method therefor, and more specifically relates to an actuator diagnostic apparatus of an electronic control unit which is capable of diagnosing shutdown of an actuator even when the battery voltage is insufficient during a cranking step so as to be able to be ready for vehicular emergencies, and to a method therefor.

Generally, electronic control units (ECUs) of vehicles receive input of signals from various sensors which have been provided for the engine, transmission, brakes, cooling water temperature, exhaust pressure and the like, so as to transfer the statuses thereof to the driver, and receive input of operational commands from the driver so as to control the engine, transmission, brakes and various lamps of the vehicle.

Such electronic control units are becoming multifunctional and are becoming high tech as the core components of vehicles for increasing fuel efficiency, safety or convenience.

Automatic transmissions are provided with a low and reverse brake (L/R), second brake (2ND), under drive clutch (U/D), and over drive clutch (O/D) power transmission means. Each of these power transmission means switches operation by means of a solenoid valve provided in a valve body, and the solenoid valve is driven by means of a drive signal from a transmission control unit (TCU) which is an electronic control unit so as to accomplish a gear shift.

Accordingly, it is very important to regularly check whether such an electronic control unit is operating normally by diagnosing the status of the electronic control unit. That is, it is extremely useful to not only prevent vehicle breakdown in advance, but also to prevent environmental pollution by exhaust gases etc. through periodic checks.

The background art of the present invention is described in Korean Registered Patent Publication No. 0577711 (Published 10 May 2006, METHOD FOR DIAGNOSING ERROR OF AUTOMATIC TRANSMISSION).

Details of the Invention

Problem to be Solved

Electronic control units of vehicles are provided such that, when an emergency situation occurs, an operation to shut down the actuator is performed in order to switch to a safe state.

Therefore, in a cranking step while turning on the vehicle, a process of diagnosing whether the shutdown operation of the actuator can be executed normally is run.

Here, shutdown diagnosis of the actuator involves turning the actuator on/off by means of a high-side driver which drives the actuator in the cranking step and then receiving input of the results so as to diagnose shutdown of the actuator, but there is a problem in that, when there is overlap between shutdown diagnosis of the actuator and the region in which the battery voltage is insufficient during the cranking operation due to a delay caused by the software operation, a precise diagnosis cannot be achieved as the diagnosis results are disregarded since diagnosis through voltage changes is not possible.

Likewise, at the output of the low-side driver which drives the actuator, there is a problem in that shutdown diagnosis is difficult in a region in which the battery voltage is insufficient, as with cranking, since the threshold value for shutdown diagnosis of the actuator cannot be lowered due to leakage of current biasing for detecting the open load.

SUMMARY OF THE INVENTION

The present invention has been conceived in order to improve upon problems such as those described above, and the object of the present invention according to one aspect is to provide: an actuator diagnostic apparatus of an electronic control unit for a vehicle which is capable of diagnosing shutdown of an actuator even when the battery voltage is insufficient during a cranking step so as to be able to be ready for vehicular emergencies; and a method therefor.

Means of Solving the Problem

An actuator diagnostic apparatus of an electronic control unit for a vehicle according to an aspect of the present invention is characterized by comprising: a high-side driver which drives an actuator from a high-side; an output voltage sensing unit which senses an output voltage of the high-side driver; a low-side driver which drives the actuator from a low-side; a pull-down switch which pulls down an input voltage of the high-side driver; a shutdown driver which actuates the pull-down switch; and a diagnostic control unit which diagnoses shutdown of the actuator upon receiving an input of the output voltage from the output voltage sensing unit after respectively actuating the high-side driver, the low-side driver, and the shutdown driver in accordance with a shutdown diagnosis order.

A characterizing feature of the present invention is that the diagnostic control unit sequentially actuates the low-side driver, the high-side driver, and the shutdown driver in that order in accordance with the shutdown diagnosis order.

The present invention further comprises: a pull-down resistor which is capable of switching to an output terminal of the high-side driver, and is characterized in that the diagnostic control unit actuates the pull-down resistor together with the low-side driver.

The present invention is characterized by further comprising: an output unit which outputs the actuator shutdown diagnosis results of the diagnostic control unit.

An actuator diagnostic method for an electronic control unit for a vehicle according to another aspect of the present invention is characterized by comprising steps of: removing, by a diagnostic control unit, leakage current by driving a low-side driver which drives an actuator from a low-side; outputting, by the diagnostic control unit, a high signal to the actuator by driving a high-side driver which drives the actuator from a high-side; turning on, by the diagnostic control unit, a pull-down switch connected to an input terminal of the high-side driver by driving a shutdown driver; receiving, by the diagnostic control unit, an input of an output voltage of the high-side driver from an output voltage sensing unit; and diagnosing, by the diagnostic control unit, shutdown of the actuator based on a change in the output voltage.

A characterizing feature of the present invention is that the step of removing the leakage current further comprises a step of: actuating, by the diagnostic control unit, the pull-down resistor which is installed on an output terminal of the high-side driver.

The present invention is characterized by further comprising a step of: outputting the actuator shutdown diagnosis results of the diagnostic control unit.

Advantages of the Invention

The actuator diagnostic apparatus of an electronic control unit for a vehicle according to an aspect of the present invention and the method therefor can improve the operating range for diagnosing shutdown of the actuator as the threshold value for shutdown diagnosis can be lowered by removing leakage current of the actuator even when the battery voltage is insufficient during a cranking step so as to be able to be ready for vehicular emergencies.

DETAILED DESCRIPTION OF THE INVENTION

Figure 1:
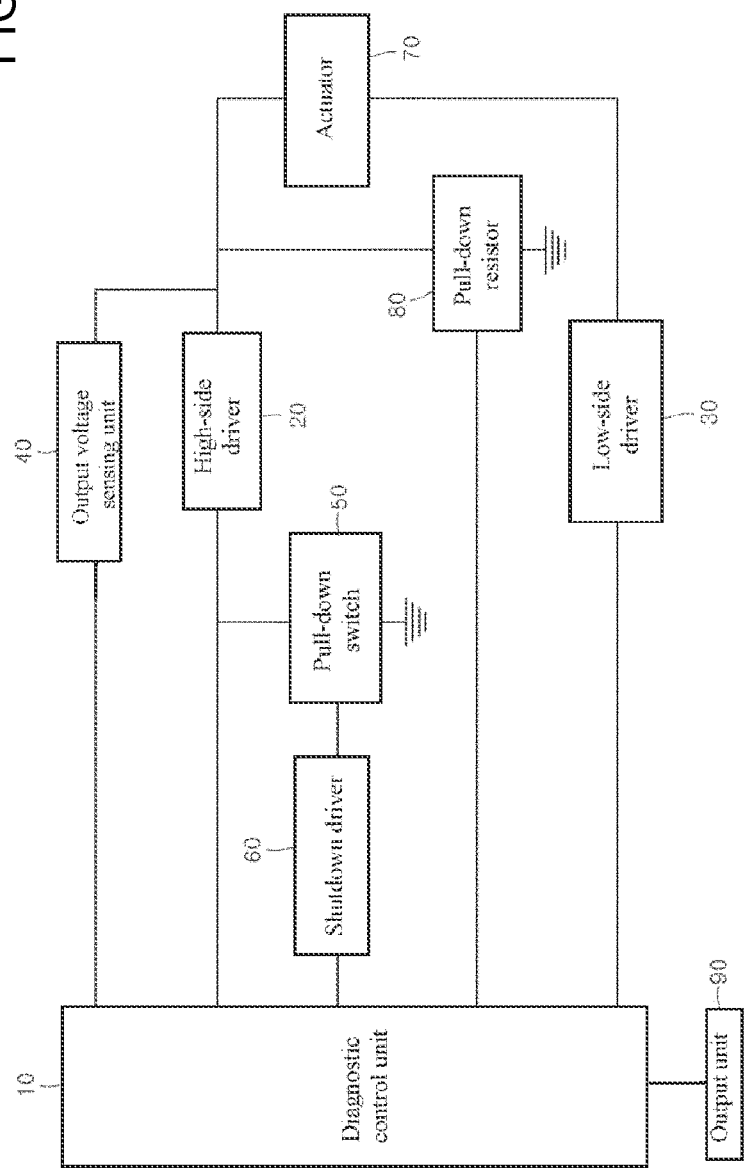
FIG. 1 is a block diagram showing the actuator diagnostic apparatus of an electronic control unit for a vehicle according to an embodiment of the present invention.

Hereinafter, the actuator diagnostic apparatus of an electronic control unit for a vehicle and the method therefor according to the present invention will be described with reference to the accompanying drawings. In this context, details such as the thickness of lines or the sizes of the components shown in the drawings may be exaggerated for clarity of the description and convenience. In addition, the terms mentioned hereinbelow are defined in relation to their functions in the present invention, and can vary depending on the intention of the user or operator, or on customary practice. Thus, definitions of such terms should be made based on the contents throughout this specification.

Figure 2:
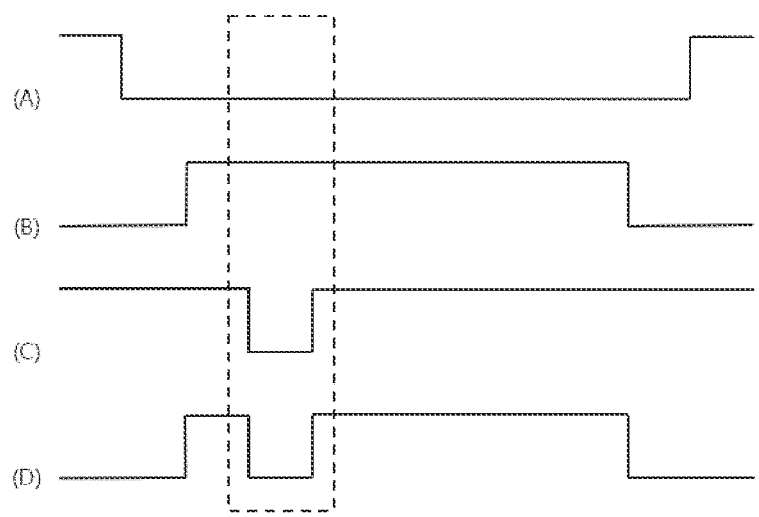
FIG. 2 is a shutdown diagnosis timing diagram for the actuator diagnostic apparatus of an electronic control unit for a vehicle according to an embodiment of the present invention.

FIG. 1 is a block diagram showing the actuator diagnostic apparatus of an electronic control unit for a vehicle according to an embodiment of the present invention, and FIG. 2 is a shutdown diagnosis timing diagram for the actuator diagnostic apparatus of an electronic control unit for a vehicle according to an embodiment of the present invention.

As shown in FIG. 1, the actuator diagnostic apparatus of an electronic control unit for a vehicle according to an embodiment of the present invention can comprise: a high-side driver (20); an output voltage sensing unit (40); a low-side driver (30); a pull-down switch (50); a shutdown driver (60); and a diagnostic control unit (10); and can also comprise a pull-down resistor (80).

The high-side driver (20) can drive an actuator (70) by applying a high signal to the actuator (70) from the high-side of the actuator (70).

Here, the actuator (70) can include, for example, a solenoid valve of an automatic transmission which is driven by means of the electronic control unit.

The output voltage sensing unit (40) detects the output voltage of the high-side driver (20) and provides same to the diagnostic control unit (10), thereby enabling the diagnostic control unit (10) to diagnose a shutdown of the actuator through a change in the output voltage.

The low-side driver (30) can drive the actuator (70) by applying a low signal to the actuator (70) from the low-side of the actuator (70).

The pull-down switch (50) can shut down the actuator (70) by pulling down the input voltage of the high-side driver (20).

The shutdown driver (60) can shut down the actuator (70) by actuating the pull-down switch (50) in accordance with the results of a safety function such as an overvoltage/undervoltage check, hardware self-testing, or a communication check.

The diagnostic control unit (10) can diagnose shutdown of the actuator (70) by receiving input of the output voltage from the output voltage sensing unit (40) after respectively actuating the high-side driver (20), the low-side driver (30), and the shutdown driver (60) in accordance with a shutdown diagnosis order.

Here, insofar as the shutdown diagnosis order of the actuator (70) is concerned, it is possible to sequentially actuate the low-side driver (30), the high-side driver (20), and the shutdown driver (60) in that order.

Looking at the shutdown diagnosis timing diagram for the actuator diagnostic apparatus of an electronic control unit for a vehicle as shown in FIG. 2, after the low-side driver (30) is driven so as to remove the leakage current of the actuator (70) to give a low voltage as in (A), a high signal is output via the high-side driver (20) as in (B). Then, when the shutdown driver (60) is driven so as to shut down the actuator (70) via the pull-down switch (50) as in (C), it is determined whether the output voltage of the high-side driver (20) has changed to a low voltage so as to enable shutdown diagnosis of the actuator (70) to be performed as in (D).

Meanwhile, the pull-down resistor (80) is a switching-capable resistor provided on the output terminal of the high-side driver (20) in order to remove leakage current caused by a biasing current of the low-side driver (30) and so may be formed as a turn-on resistor of a field effect transistor (FET).

Therefore, when diagnosing shutdown of the actuator (70) in the cranking step, the diagnostic control unit (10) actuates the pull-down resistor (80), thereby enabling a discharge path to form so as to remove leakage current.

An output unit (90) can operate such that a warning is given and start-up does not happen when the shutdown diagnosis results of the actuator (70) from the diagnostic control unit (10) are output to a different electronic control unit of the vehicle and there is an irregularity in the shutdown diagnosis results of the actuator (70).

According to the actuator diagnostic apparatus of an electronic control unit for a vehicle as in the embodiment of the present invention as described above, the operating range for diagnosing shutdown of the actuator can be improved as the threshold value for shutdown diagnosis can be lowered by removing leakage current of the actuator even when the battery voltage is insufficient during a cranking step so as to be able to be ready for vehicular emergencies.

Figure 3:
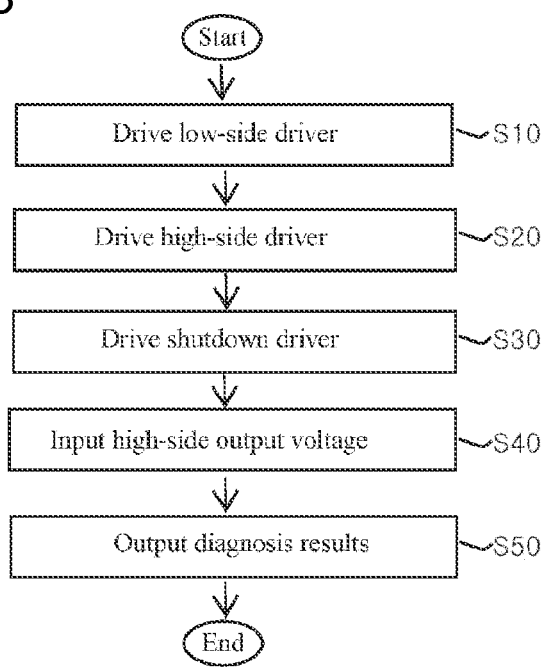
FIG. 3 is a flowchart for explaining the actuator diagnostic method for an electronic control unit for a vehicle according to an embodiment of the present invention.

FIG. 3 is a flowchart for explaining the actuator diagnostic method for an electronic control unit for a vehicle according to an embodiment of the present invention.

As shown in FIG. 3, in the actuator diagnostic method for an electronic control unit for a vehicle according to one embodiment of the present invention, first of all, in order to diagnose shutdown of the actuator (70) in the cranking step, the diagnostic control unit (10) removes (S10) leakage current by driving the low-side driver (30) which drives the actuator (70) from the low-side.

Here, when a switch-capable pull-down resistor (80) is provided on the output terminal of the high-side driver (20), the diagnostic control unit (10) can also remove leakage current by actuating the pull-down resistor (80) to form a discharge path.

After removing the leakage current in step S10, the diagnostic control unit (10) outputs (S20) a high signal to the actuator (70) by driving the high-side driver (20) which drives the actuator (70) from the high-side.

After outputting the high signal to the actuator (70) in step S20, the diagnostic control unit (10) shuts down (S30) the actuator (70) by turning on the pull-down switch (50) connected to the input terminal of the high-side driver (20) by driving the shutdown driver (60).

After shutting down the actuator (70) in step S30, the diagnostic control unit (10) receives (S40) input of the output voltage of the high-side driver (20) from the output voltage sensing unit (40).

After receiving input of the output voltage in step S40, the diagnostic control unit (10) diagnoses shutdown of the actuator (70) on the basis of change in output voltage, and outputs (S50) the diagnosis results.

As described above, according to the actuator diagnostic method for an electronic control unit for a vehicle in the embodiment of the present invention, the operating range for diagnosing shutdown of the actuator can be improved as the threshold value for shutdown diagnosis can be lowered by removing leakage current of the actuator even when the battery voltage is insufficient during a cranking step so as to be able to be ready for vehicular emergencies.

The embodiment described in the present specification can be realized as, for example, a method or process, apparatus, software program, data stream or signal. Despite being discussed only in the context of a single form of embodiment (for example, discussed only as a method), embodiments of the discussed features can also be realized in other forms (for example, an apparatus or program). Apparatuses can be implemented using appropriate hardware, software and firmware etc. Methods can be implemented in apparatuses such as processors which are generally called processing devices which, for example, include computers, microprocessors, integrated circuits and programmable logic devices. Processors include communication devices that facilitate the communication of information between end users such as computers, cell phones, portable/individual information terminals (personal digital assistants, PDAs) and other devices.

Although the present invention has been described with reference to the embodiments illustrated in the drawings, this is merely illustrative. It will be understood by those skilled in the art to which the present technology belongs that it is possible to implement various modifications and other equivalent embodiments based thereon.

Accordingly, the true technical protection scope of the present invention should be determined by the claims below.

[Description of the Reference Numerals]

| | |
|---|---|
| 10: Diagnostic control unit | 20: High-side driver |
| 30: Low-side driver | 40: Output voltage sensing unit |
| 50: Pull-down switch | 60: Shutdown driver |
| 70: Actuator | 80: Pull-down resistor |
| 90: Output unit | |

The invention claimed is:

1. An actuator diagnostic apparatus of an electronic control unit for a vehicle, the actuator diagnostic apparatus comprising:
 a high-side driver for driving an actuator from a high-side;
 an output voltage sensing unit for sensing an output voltage of said high-side driver;
 a low-side driver for driving the actuator from a low-side;
 a pull-down switch for pulling down an input voltage of said high-side driver;
 a shutdown driver for actuating said pull-down switch; and
 a diagnostic controller for diagnosing a shutdown of the actuator upon receiving an input of the output voltage from said output voltage sensing unit after respectively actuating said high-side driver, said low-side driver, and said shutdown driver in accordance with a shutdown diagnosis order.

2. The actuator diagnostic apparatus according to claim 1, wherein said diagnostic controller sequentially actuates said low-side driver, said high-side driver, and said shutdown driver in that order in accordance with the shutdown diagnosis order.

3. The actuator diagnostic apparatus according to claim 1, further comprising a pull-down resistor being capable of switching to an output terminal of said high-side driver; and
 wherein said diagnostic controller actuates said pull-down resistor together with said low-side driver.

4. The actuator diagnostic apparatus according to claim 1, further comprising an output unit which outputs actuator shutdown diagnosis results of said diagnostic controller.

5. An actuator diagnostic method for an electronic control unit for a vehicle, which comprises the steps of:
 removing, by a diagnostic controller, leakage current by driving a low-side driver driving an actuator from a low-side;
 outputting, by the diagnostic controller, a high signal to the actuator by driving a high-side driver which drives the actuator from a high-side;
 turning on, by the diagnostic controller, a pull-down switch connected to an input terminal of the high-side driver by driving a shutdown driver;
 receiving, by the diagnostic controller, an input of an output voltage of the high-side driver from an output voltage sensing unit; and
 diagnosing, by the diagnostic controller, a shutdown of the actuator based on a change in the output voltage.

6. The method according to claim 5, wherein the step of removing the leakage current further comprises a step of actuating, by the diagnostic controller, a pull-down resistor which is installed on an output terminal of the high-side driver.

7. The method according to claim 5, which further comprises outputting actuator shutdown diagnosis results of the diagnostic controller.

* * * * *